United States Patent
DeAndrea et al.

(10) Patent No.: US 6,671,154 B1
(45) Date of Patent: Dec. 30, 2003

(54) SURGE PROTECTOR FOR HIGH SPEED DATA NETWORKS

(75) Inventors: John J DeAndrea, Yardley, PA (US); Carmen Lanzetta, New Hope, PA (US)

(73) Assignee: Lanetics, Inc., New Hope, PA (US)

( * ) Notice: Subject to any disclaimer, the term of this patent is extended or adjusted under 35 U.S.C. 154(b) by 224 days.

(21) Appl. No.: 09/610,266

(22) Filed: Jul. 6, 2000

Related U.S. Application Data

(60) Provisional application No. 60/179,859, filed on Feb. 2, 2000.

(51) Int. Cl.[7] .............................................. H01R 13/66
(52) U.S. Cl. ....................... 361/118; 361/91.5; 439/76.1
(58) Field of Search ................................ 439/76.1, 404; 361/117, 118, 119, 91.5, 91.6

(56) References Cited

U.S. PATENT DOCUMENTS

| | | | | |
|---|---|---|---|---|
| 4,799,901 A | * | 1/1989 | Pirc ............................ | 439/620 |
| 5,091,826 A | * | 2/1992 | Arnett et al. ................ | 361/408 |
| 5,718,593 A | * | 2/1998 | Figueiredo et al. ......... | 439/76.1 |
| 5,902,138 A | * | 5/1999 | Murakami .................. | 439/76.2 |
| 5,995,380 A | * | 11/1999 | Maue et al. ................. | 361/826 |
| 6,224,397 B1 | * | 5/2001 | Nakamura .................. | 439/76.2 |
| 6,290,509 B1 | * | 9/2001 | Hattori et al. .............. | 439/76.2 |

* cited by examiner

Primary Examiner—Bao Q. Vu
(74) Attorney, Agent, or Firm—Dann Dorfman Herrell and Skillman, P.C.

(57) ABSTRACT

A surge protector for highspeed data networks is provided wherein a circuit board having a ground plane formed on one side of the circuit board, has respective pairs of conductive traces forming impedancematched transmission lines on the other side of the circuit board. Surge protection devices are connected in series with the conductors and with the ground plane. A compensating reactance may be provided along the transmission lines to correct for parasitic capacitance introduced by the threshold voltage conductor devices. Shielded and isolated connectors may be provided at either end of the circuit board to minimize insertion loss and provide isolation between respective transmission lines.

13 Claims, 3 Drawing Sheets

United States Patent 6,671,154 B1

SURGE PROTECTOR FOR HIGH SPEED DATA NETWORKS

CROSSREFERENCE TO RELATED APPLICATION

Priority is claimed herein to U.S. application Ser. No. 60/179,859, filed Feb. 2, 2000, which is incorporated in its entirety by reference herein.

FIELD OF THE INVENTION

The present invention relates to a surge protector for high speed data networks. In particular, the invention relates to a surge protector apparatus providing a matched impedance to twistedpair electrical transmission media.

BACKGROUND

Conductive wire interconnections continue to be widely used for high speed computer networks, even though they were once believed to be in jeopardy of imminent obsolescence by fiber optic cables. Because many installations have a legacy investment in computer networks based on conductive wires, and due to other economic and easeofuse considerations, it has been found desirable to develop ways of increasing data transmission speeds on existing conductivebased computer network installations, rather than to replace them. Conductive computer networks, based on twistedpair cable technology, continue to be maintained and installed to meet higher operating bandwidth specifications.

Conductive wirebased computer networks are vulnerable to transients or surges due to, for example, lightning strikes in the vicinity of the network. A nearby lightning strike can induce voltage levels in the conductors constituting the network that are sufficiently high to damage terminal equipment connected to the network. The typical solution to this problem is to connect transient voltage suppression devices between the wires of the network and ground, in order to provide a conduction path for high voltage surges to discharge. Adding such devices, however, places a parasitic reactive load on the conductors. With the increasing bandwidth demands required of computer networks, the ability to conduct high speed data transmission can be impaired by radiative losses and crosstalk which occur whenever the pairs of the transmission cable are connected to a surge suppression device. Such impairments include radiative and coupling losses from the connectors employed to attach the wires to the surge suppression device, losses due to impedance mismatch with the suppression device itself, radiative loss due to the necessity to split the individual pairs for connection with voltage suppressors, as well as the parasitic impedance of the voltage suppressors.

In U.S. Pat. No. 5,706,160 there is shown a proposed surge arrester arrangement in which numerous banks of diodes are connected with conductive traces of a circuit board corresponding to the pairs of a twistedpair based signal transmission system. Additionally, the patent proposes the use of a verticallypositioned shield upon the circuit board in order to reduce crosstalk between conductors of the surge arrester. It would be desirable to provide a surge arrester for high speed computer networks which employed fewer parts and was simpler in overall assembly.

SUMMARY

According to one aspect of the invention a surge arrester for twistedpair transmission systems is provided in which each pair of a transmission cable is connected to a circuit board on which an impedancematching stripline is formed on one side of the circuit board. Corresponding isolated ground plane areas are provided on the other side of the circuit board in order to confine radiated signals to the respective vicinities of the striplines. A threshold voltage conduction circuit is connected along each stripline. The connection to the threshold voltage conduction circuit may be geometrically formed as a microstrip to provide a compensating reactance in series with the threshold voltage conduction circuit. Additionally, the threshold conduction circuit may comprise a series combination of threshold voltage conduction devices in order to present a selected capacitive load to the microstrip.

DETAILED DESCRIPTION

Figure 1:
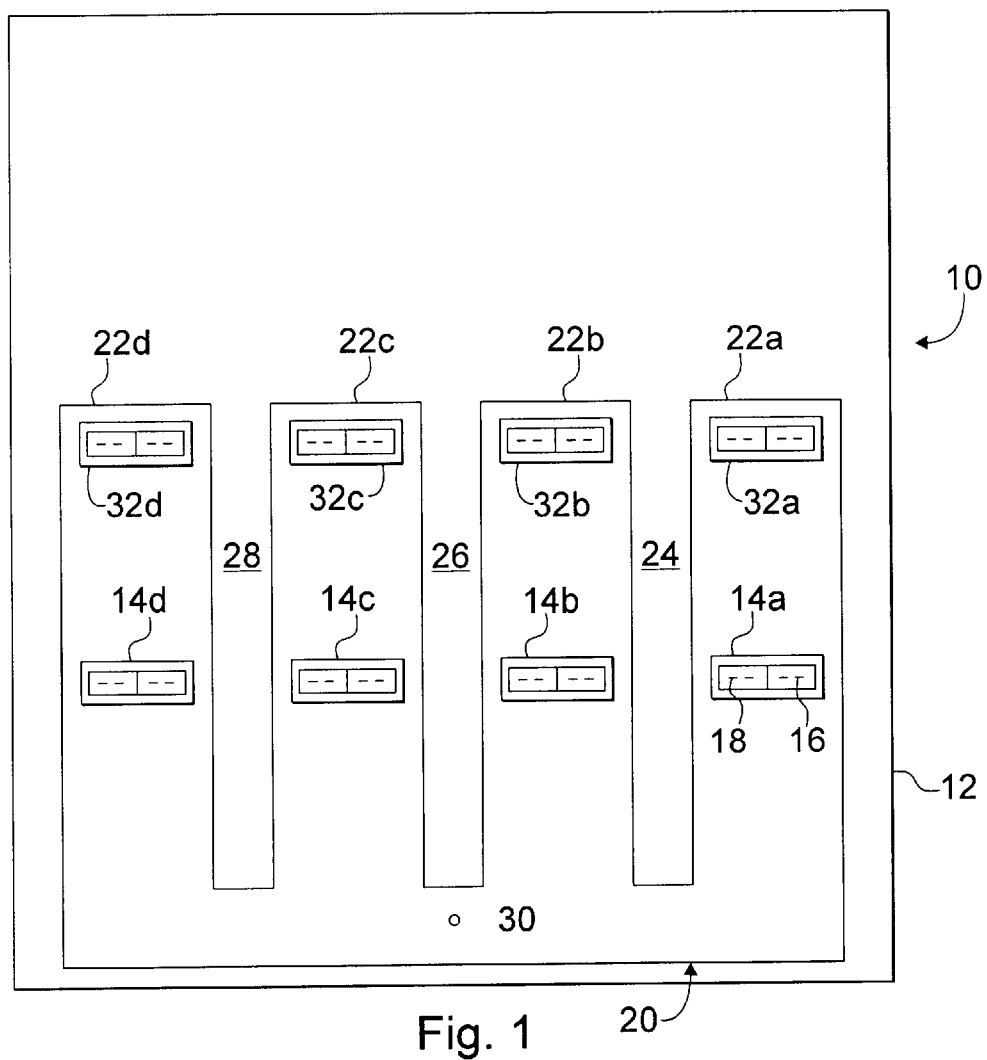
FIG. 1 is a top plan view of a printed circuit board for a surge arrester in accordance with the invention.
Figure 2:
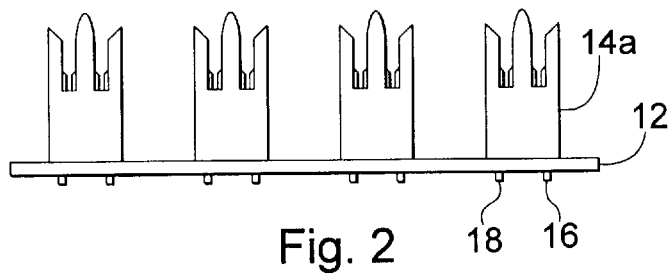
FIG. 2 is a side view of a printed circuit board of the surge arrester of FIG. 1 as seen along the line 2—2.

Referring now to FIG. 1, there is shown a surge arrester 10. The surge arrester 10 comprises a circuit board 12, such as a glassepoxy circuit board, upon which are mounted several connectors 14a–d for receiving respective pairs of a twisted pair transmission cable (not shown). The connectors 14a–d are preferably of the type referred to as "punch down" connectors, having compressive contact members formed in a plastic housing for simultaneously penetrating the insulation of a wire and for obtaining electrical contact with the conductor therein. Each of the connectors 14a–d is arranged to receive a single pair of wires within respective compressive contact members, of which 16 and 18 are typical. The connectors 14a–d are spaced apart from one another in order to reduce crosstalk between the exposed pairs of wires connected therein. The connectors may be of a conventional type, as shown in FIG. 2, or may comprise shielded punchdown connectors or impedancematched RJ45 connectors such as are described in U.S. application Ser. No. 60/179, 859. In alternative embodiments, various other types of connectors may be provided.

Figure 4:
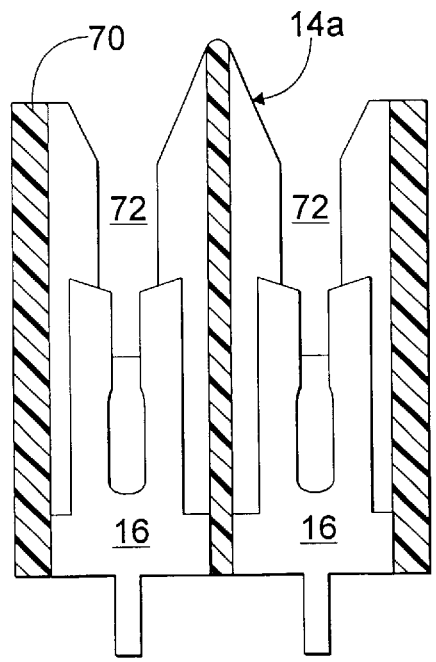
FIG. 4 is an elevational cutaway view of an electrical connector employed in the surge arrestor of FIG. 1.

Referring now to FIG. 4, there is shown a cutaway view of connector 14a. The connector block 14a comprises an insulating body 70 within which is positioned a linear array of connector members 16, 18. Each of the connector members 16, 18 comprises a forked planar conductor forming a compressive jaw for receiving a conductor such as a wire therein. The interior surfaces of the jaws are sufficiently thin or sharp so that the interior surfaces of the jaws will penetrate the insulator of an insulated wire inserted therein and establish a compressive contact with respective sides of the conductor. The bottoms of the connector members have mounting pins formed to extend out of the bottom of the insulating body 70 for mounting the connector 14a upon the circuit board and for establishing electrical connection with the conductive traces of the circuit board. The insulating body 58 of the connector block 54a is formed to provide verticallyextending guiding channels having a Vshaped wirereceiving top portion, and aligned with the compressive jaws of the forked conductors, for receiving and aligning wires to be inserted into the jaws.

Figure 5:
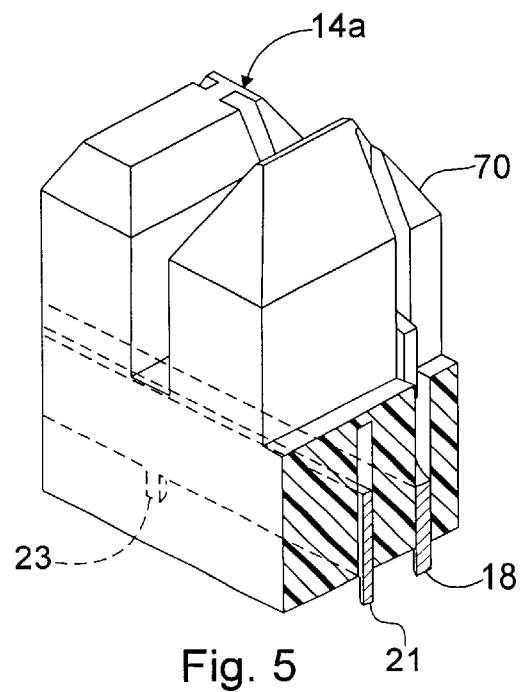
FIG. 5 is a perspective cutaway view of the connector of FIG. 4.

Referring now to FIG. 5, a shielding member 21 is also housed within the insulating body of the connector block 14a. Shielding member 21 comprises a planar conductor held vertically within the connector block 14a to extend horizontally and in parallel to the connector members 16 and 18. The dielectric constant of the insulating material forming the housing 58, and the separation distance between the shielding member 21 and the respective connector members 16, 18 are selected to provide an independence substantially matched to a standard transmission cable, e.g., 100 Ω. The bottom of shielding member is formed to have at least one connector pin, such as pin 23 extending out of the bottom of the insulating body 70 for mounting the connector block 14a upon the circuit board and for establishing electrical connection between the shielding member and the ground plane of the circuit board. The shielding member 21 serves to confine fringing fields from the connector members to the space between the connector members and the shielding member, in order to provide impedance matching and to reduce crosstalk and radiative loss relative to conventional compressive a connector blocks.

A ground plane 20 is formed on the top surface of the circuit board 12. The ground plane area 20 is formed to provide respective ground plane areas 22a–d, which are separated along their length by isolation channels 24, 26, and 28. The isolation channels 24, 26, and 28 provide localized isolation of the ground plane areas, as shall be discussed further below. In operation, the ground plane areas 22a–d are connected to ground. A plated throughhole 30 provides a ground connection to the other side of the circuit board 12.

Also mounted on the circuit board 12 are respective electrical connectors 32a–d, which are mounted at opposite ends of respective ground plane areas 22a–d from the connectors 14a–d. The connectors 14a and 32a provide input and output terminals for one of four pairs of conductors that can be connected to the surge arrester. The circuit components associated with providing surge protection for the corresponding pair of conductors shall now be described, and it will be understood that similar components are provided for each pair of the four pairs.

Figure 3:
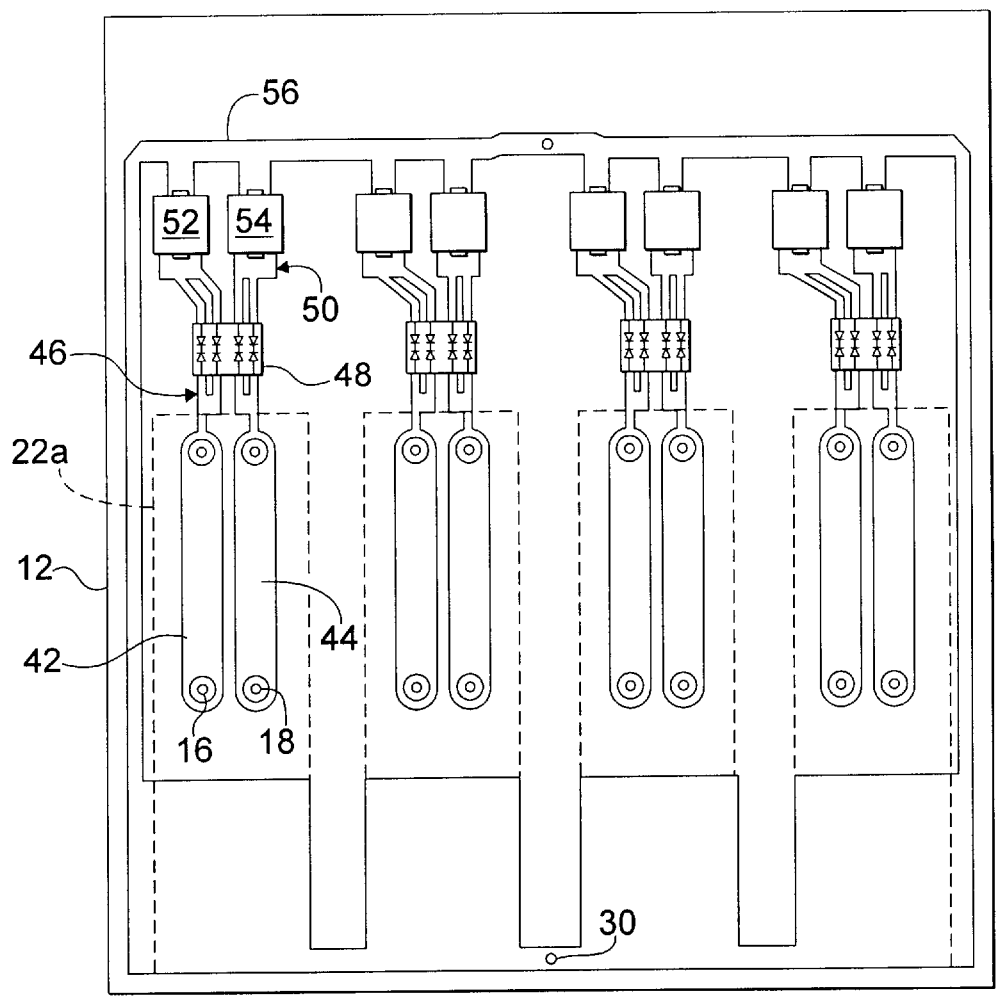
FIG. 3 is a bottom plan view of the circuit board of FIG. 1.

As shown in FIG. 2, the compressive contact members 16 and 18 penetrate the board 12. Referring to FIG. 3, the compressive contact members 16 and 18 emerge from the board and are connected with one end of each of parallel stripline conductors 42 and 44. The stripline conductors 42 and 44 are sized and spaced apart in accordance with the electrical permitivity of the circuit board to provide a transmission line along the length thereof that is impedance-matched to the corresponding pair of the transmission cable. At the other end of the parallel stripline conductors 42 and 44, a second pair of compressive contact members are connected to provide electrical connection with the connector 32a.

The stripline conductors 42 and 44 are located on the bottom of the board and aligned with ground plane area 22 to provide confinement of electrical fields between the two stripline conductors, and between the respective conductors and the ground plane area 22. Adjacent pairs of stripline conductors are arranged in parallel such that each pair is spaced apart to reduce crosstalk. Additional crosstalk isolation is provided by the isolation gaps between adjacent ground plane areas, so that mirror or eddy currents induced in one ground plane area do not inductively couple into adjacent stripline conductors. The ground plane area 22a extends along the circuit board 12 along the entire length of the stripline conductors from the input connector 14a to the output connector 32a, so that shielding is provided along the entire length of the data communication path through the device. The use of such ground planes provides impedance matching and reduces radiative emissions along the length of the stripline conductors.

Threshold voltage conduction devices are connected between ground and a connection point on the stripline conductors. As shown in FIG. 3, one such connection arrangement is a conductive trace 46 leading from one end of the stripline conductor 42 as an input to one or more threshold voltage conduction devices 48, preferably a pair of transient protection diodes such as a pair of SEMTECH LCDA12 surface mounted diodes. Diodes of this type are provided in a quad surfacemountable package, and include integrated lowcapacitance compensation diodes in series with TVS (transient voltage suppression) breakdown diodes.

A second threshold conduction device 52 is connected in series with the device 48 via an interconnection 50 formed on the circuit board 12. In a preferred embodiment, the device 52 comprises a VISHAY SMBJ20(c)A bidirectional transient voltage suppressor.

The second threshold conduction device 52 is connected with a ground trace 56 which is connected to the other grounded elements on the board 12. It should be noted that providing multiple threshold voltage conduction devices in series provides a reduced capacitance for the overall surge conduction path. Additionally, the interconnection traces 46 between the striplines 42 and 44 and the threshold voltage conduction devices can be sized relative to the striplines to provide a geometric discontinuity that produces an effective compensating reactance to negate the parasitic capacitance presented by the threshold voltage conduction devices. In an alternative embodiment, a discrete inductive device, or an additional geometric discontinuity, can be connected or formed along the striplines in order to provide a sufficient compensating reactance for other arrangements of threshold voltage conduction devices.

It will be appreciated that the provision of an impedance-matched stripline arrangement along the entire length of the signal path through the surge arrester provides for surge protection without the load penalty associated with known surge protection devices. It shall also be appreciated that the provision of isolated ground plane confinement of radiative fields contributes to the impedance matching of the striplines and reduces crosstalk between adjacent pairs of conductors without requiring additional shielding structures to be attached to the board during assembly. Hence, there is hereby provided a surge protection arrangement that is compatible with traditional circuit board manufacturing techniques, which is operable at substantially higher bandwidths than have been provided in the past in such devices.

The terms and expressions employed herein are terms of description and not of limitation. There is no intention to limit the scope of the invention by the use of such terms, but to provide a exemplary description of a preferred embodiment. The invention is to be determined with reference to the appended claims, and to all equivalents thereof.

That which is claimed is:

1. A surge protector, comprising:
   a circuit board;
   a ground plane formed on one side of the circuit board;
   a first connector mounted on the circuit board, and having respective contacts for receiving a pair of electrical conductors of a first transmission line;

a pair of conductive traces formed on the other side of the circuit board in electrical connection with the respective contacts of the first connector, said pair of conductive traces being sized and spaced apart to provide a matching impedance with the transmission line;

a second connector mounted on the circuit board, and having respective contacts for receiving a pair of electrical conductors of a second transmission line and in electrical connection with the respective conductive traces; and respective threshold voltage conduction devices electrically connected between the conductive traces and the ground plane.

2. The surge protector of claim 1, comprising a compensating reactance connected between the conductive traces and the threshold voltage conductive devices.

3. The surge protector of claim 2, wherein the compensating reactance is formed by a geometrical variation of the traces.

4. The surge protector of claim 1 wherein the ground plane extends along said one side of the circuit board for substantially the entire length of the traces between the first and second connector.

5. The surge protector of claim 1 wherein the first connector comprises:

a punch down connector having an insulating body;

a connector member positioned in the insulating body and having a compressive jaw formed therein for receiving a wire; and a conductive shielding member spaced apart from the connector member for confining electromagnetic fields therebetween.

6. The surge protector of claim 5 wherein the ground plane extends along said one side of the circuit board for substantially the entire length of the traces between the first and second connector.

7. A surge protector, comprising:

a circuit board;

a ground plane formed on one side of the circuit board;

respective pairs of conductive traces formed on the other side of the circuit board, providing respective stripline pairs that are impedance matched with a data transmission line; and respective threshold voltage conduction devices electrically connected between each of the conductive traces and the ground plane.

8. The surge protector of claim 7, wherein the ground plane is formed to provide isolation between respective ground plane regions thereof opposite to the respective pairs of conductive traces.

9. The surge protector of claim 8 comprising respective first connectors mounted on the circuit board; each of the first connectors formed to receive a pair of conductors and to provide electrical connection to a corresponding pair of said conductive traces; wherein each of the first connectors is mounted in a spacedapart relation to the other connectors to provide electrical isolation therebetween.

10. The surge protector of claim 9 wherein each of the first connectors is a punchdown connector.

11. The surge protector of claim 10 wherein each of the first connectors comprises a shielding member mounted therein and electrically connected with the ground plane.

12. An electrical connector for connecting wires with a circuit board, comprising:

an insulating body having a wirereceiving channel open at one end thereof;

a conductive member positioned in the insulating body and having an edge portion extending into and constricting at least a portion of the wirereceiving channel;

a first mounting pin connected with the conductive member and extending out of the insulating body for connection with the circuit board;

a conductive shielding member positioned in the insulating body adjacent to and in parallel with the conductive member;

a second mounting pin connected with the conductive shielding member and extending out of the insulating body for connecting with the circuit board.

13. The electrical connector of claim 12 wherein the conductive member comprises jaw positioned in the wirereceiving channel, and wherein the edge portion is positioned on the jaw for piercing an insulating jacket to establish contact with the wire.

* * * * *